(12) United States Patent
Rose et al.

(10) Patent No.: US 10,698,001 B2
(45) Date of Patent: Jun. 30, 2020

(54) INTEGRATED MODULAR INTEGRATED CIRCUIT TEST FIXTURE AND HANDLER INTERFACE

(71) Applicant: Silicon Laboratories Inc., Austin, TX (US)

(72) Inventors: Larry R. Rose, Buda, TX (US); Wenshui Zhang, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 119 days.

(21) Appl. No.: 15/824,128

(22) Filed: Nov. 28, 2017

(65) Prior Publication Data

US 2019/0162755 A1     May 30, 2019

(51) Int. Cl.
*G01R 1/04* (2006.01)

(52) U.S. Cl.
CPC ......... *G01R 1/0466* (2013.01); *G01R 1/0408* (2013.01)

(58) Field of Classification Search
USPC ................. 324/756.01–756.05; 439/620.01
See application file for complete search history.

(56) References Cited

U.S. PATENT DOCUMENTS

| 6,046,597 | A  | * | 4/2000 | Barabi  | G01R 1/0483 257/E23.078 |
| 7,034,520 | B1 | * | 4/2006 | Miller  | G01R 31/2889 324/756.02 |
| 9,274,140 | B2 |   | 3/2016 | Rose et al. | |

* cited by examiner

*Primary Examiner* — Vincent Q Nguyen
(74) *Attorney, Agent, or Firm* — Zagorin Cave LLP

(57) ABSTRACT

A modular integrated circuit test fixture integrates the integrated circuit (IC) handler to IC test fixture alignment interface (the alignment plate) into a daughter card subassembly, which reduces the overall rejection rate of devices due to alignment errors. The test fixture has a plurality of daughter card subassemblies for receiving integrated circuits for testing. Each daughter card subassembly is independently removable from the test fixture and includes a daughter card for a particular size and type of integrated circuit, a plurality of sockets electrically and mechanically coupled to the daughter card to receive respective integrated circuits for testing, and an alignment plate to provide alignment between an IC handler and respective ones of the daughter card subassemblies and to provide alignment for one or more manual test lids. The manual test lids are removed for automatic testing using an IC handler.

14 Claims, 11 Drawing Sheets

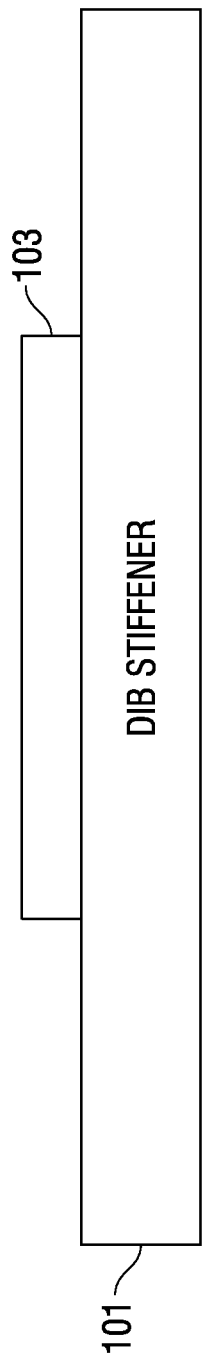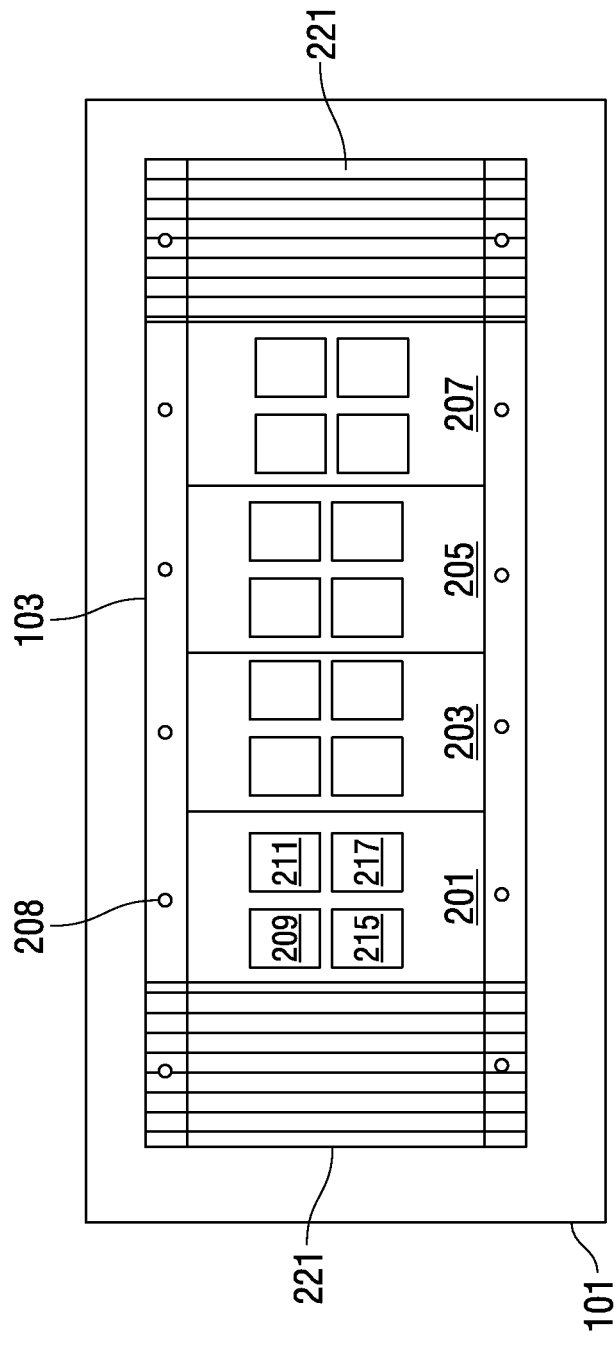

INTEGRATED MODULAR INTEGRATED CIRCUIT TEST FIXTURE AND HANDLER INTERFACE

BACKGROUND

Field of the Invention

This invention relates to test fixtures for testing integrated circuits.

Description of the Related Art

Test fixtures are used with various automatic test equipment to test integrated circuits (ICs). Test fixtures have traditionally used a monolithic printed circuit board (PCB) interface between the IC test fixture and the IC test handler. During automatic testing, the IC test handler places the integrated circuit in the test fixture for testing. The test fixture tests the devices under control from additional test equipment. When failures occur due to alignment errors or other failures associated with a particular test site in the test fixture, existing solutions require the disassembly of the entire interface between the IC test printed circuit board and the IC handler interface to access test sites that need attention. In addition, manual testing may be performed on the integrated circuits. The transition between manual testing and automatic testing requires significant disassembly of the interface between the IC test printed circuit board and the IC handler. That disassembly and reassembly can be the source of errors.

Accordingly, improvements in test fixtures to improve access and reduce errors is desirable.

SUMMARY OF EMBODIMENTS

In one embodiment, an integrated circuit (IC) test fixture includes a plurality of sockets. An alignment plate is coupled to the sockets and configured to provide alignment between an IC handler and the IC test fixture. One or more manual test lids is removably coupled to the alignment plate, the one or more manual test lids coupled to the alignment plate for manual testing one or more integrated circuits, the manual test lids removed from the alignment plate for use of the IC test fixture with the test handler.

In another embodiment an integrated circuit (IC) test fixture includes a device interface board and a plurality of daughter card subassemblies for receiving integrated circuits for testing, the plurality of daughter card subassemblies coupled to the device interface board. Each daughter card subassembly includes a daughter card, a plurality of sockets coupled to the daughter card, and an alignment plate to provide alignment between an IC handler and respective ones of the daughter card subassemblies.

In another embodiment an integrated circuit (IC) test fixture includes a plurality of daughter card subassemblies for receiving integrated circuits for testing. Each daughter card subassembly includes a daughter card, a plurality of sockets electrically and mechanically coupled to the daughter card, and an alignment plate to provide alignment between an IC handler and respective ones of the daughter card subassemblies and to provide alignment for one or more manual test lids with the daughter card subassembly.

BRIEF DESCRIPTION OF THE DRAWINGS

The present invention may be better understood, and its numerous objects, features, and advantages made apparent to those skilled in the art by referencing the accompanying drawings.

FIG. 1 illustrates a side view of an embodiment of a test fixture.

FIG. 2 illustrates a plan view of a portion of an embodiment of a test fixture.

The use of the same reference symbols in different drawings indicates similar or identical items.

DETAILED DESCRIPTION

Figure 3:
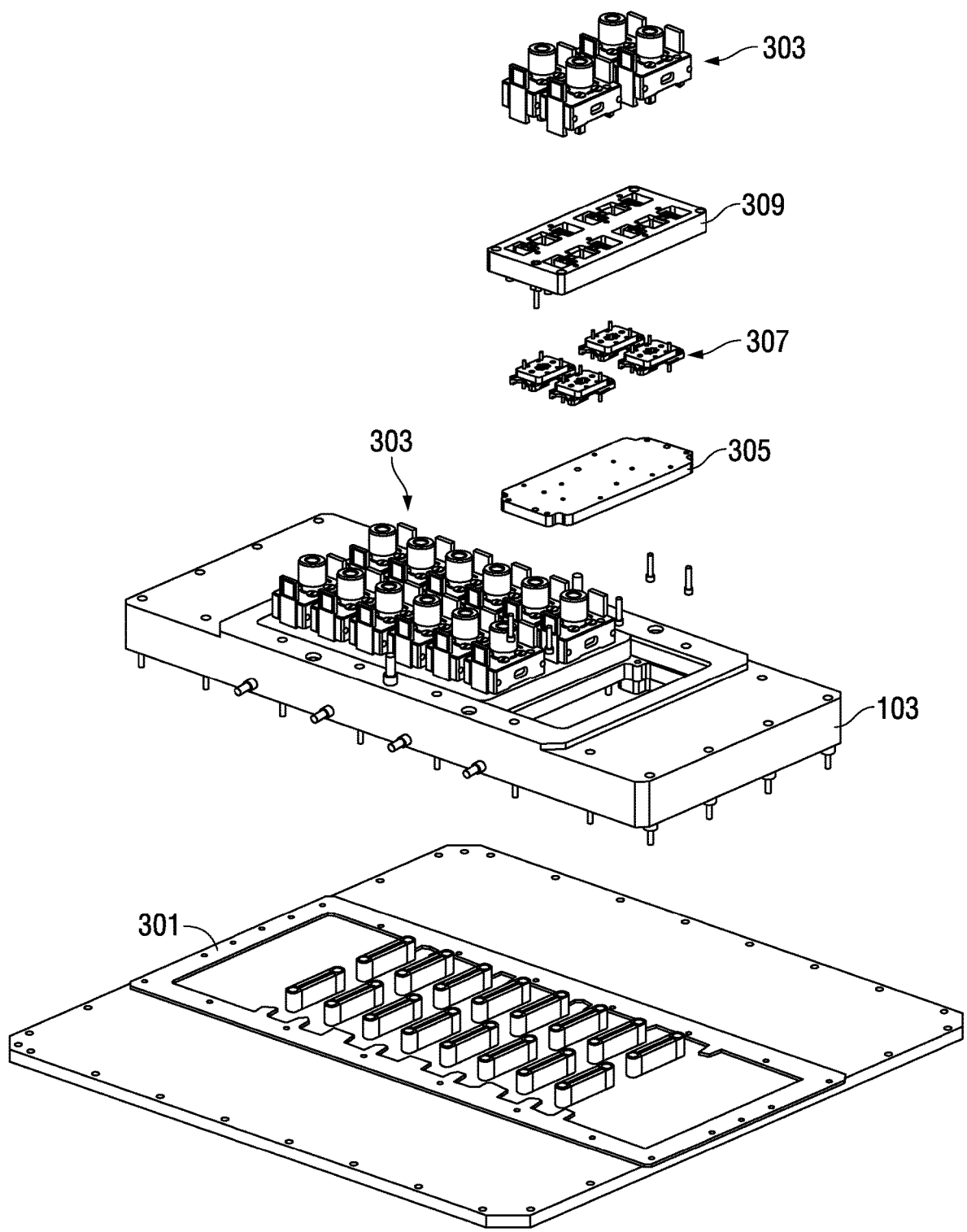
FIG. 3 illustrates an exploded view of portions of a test fixture according to an embodiment.

Embodiments of the test fixture described herein allow focused, quick access to daughter card subassemblies allowing access to any of the integrated circuit (IC) daughter test printed circuit board (PCB) locations or IC handler socket locations that form the daughter card subassemblies. The daughter card subassembly further integrates the IC handler to IC test fixture alignment in the form of an alignment card that is used for both testing with the IC handler and for manual testing. The integration reduces the overall rejection rate of devices being tested due to alignment errors. When transitioning to the IC handler testing environment from the manual test environment or vice versa, errors are reduced since the transition only involves removal (or attachment) of a manual test lid from/to the daughter card subassembly. Further, embodiments described herein provides a modular approach to the daughter card subassemblies allowing selective access to suspected problem test sites in the daughter card subassemblies while reducing the amount of time and labor required to access the suspect test sites for repair or replacement. Embodiments also allow different IC specific printed circuit boards to be used as daughter cards to support various IC package types and IC handlers.

Referring to FIG. 1, a side view of an embodiment of a test fixture that includes a device interface board (DIB) stiffener 101 that holds a device interface board. A daughter card stiffener 103 attaches to the DIB stiffener 101. The device interface board (also referred to as a base load board) couples through cables (not shown) to test equipment to send and receive test signals to devices under test.

FIG. 2 illustrates a plan view of an embodiment of a portion of a test fixture that provides 16 test sites divided into 4 identical subassemblies. The illustrated embodiment has four daughter card sub-assemblies 201, 203, 205 and 207 that mount to the daughter card stiffener 103, which in turn is mounted by screws at attachment points 208 to the DIB stiffener 101. Each of these IC test PCBs (daughter cards) has the IC test handler plunger head alignment fixture attached as explained further herein. Using modular subassemblies allows for device dedicated IC test daughter cards to be utilized. That is, different daughter cards for different ICs can reside in different subassemblies. Each daughter card sub-assembly includes four sockets (also referred to as device contactors) 209, 211, 215, and 217 into which an integrated circuit is placed for testing. The four sockets are shown in a 2×2 configuration. In other embodiments, a 4×1 configuration may be used. In addition, the daughter cards may be larger or smaller to support additional sockets or fewer sockets, e.g., in an 8×1 or 4×4 configuration. Daughter card stiffener covers 221 provide protection for anything located under the covers of the daughter card stiffener. The test fixture uses the same daughter card subassemblies for testing integrated circuits using a test handler or for manual testing.

FIG. 3 illustrates a view of an embodiment showing the device interface board 301, which attaches to the DIB stiffener 101 (FIG. 1). The stiffener serves as a frame to securely hold the device interface board. The device interface board includes 16 connectors, one for each of the test sites. The connectors electrically connect the daughter card to the device interface board. The illustrated daughter card stiffener 103 has three daughter card subassemblies attached, each of the three with manual test lids attached. In addition, FIG. 3 shows an exploded view of one of the daughter card subassemblies. The daughter card subassembly includes the daughter card 305, the sockets 307, and the alignment plate 309. The daughter card 305 is a printed circuit board and provides an electrical connection between the sockets and the device interface board 301. The alignment plate 309 serves to align the IC handler to the IC test fixture and also to align the manual test lids 303 used for manual testing integrated circuits.

When the manual testing is being performed, integrated circuits are placed in the sockets and the manual test lids ensure the integrated circuits make proper contact with the sockets 307 for testing. In the illustrated embodiment each daughter card 305 supports four sockets. There is one alignment plate 309 for each daughter card. FIG. 3 illustrates the test fixture configured for manual testing.

Figure 4:
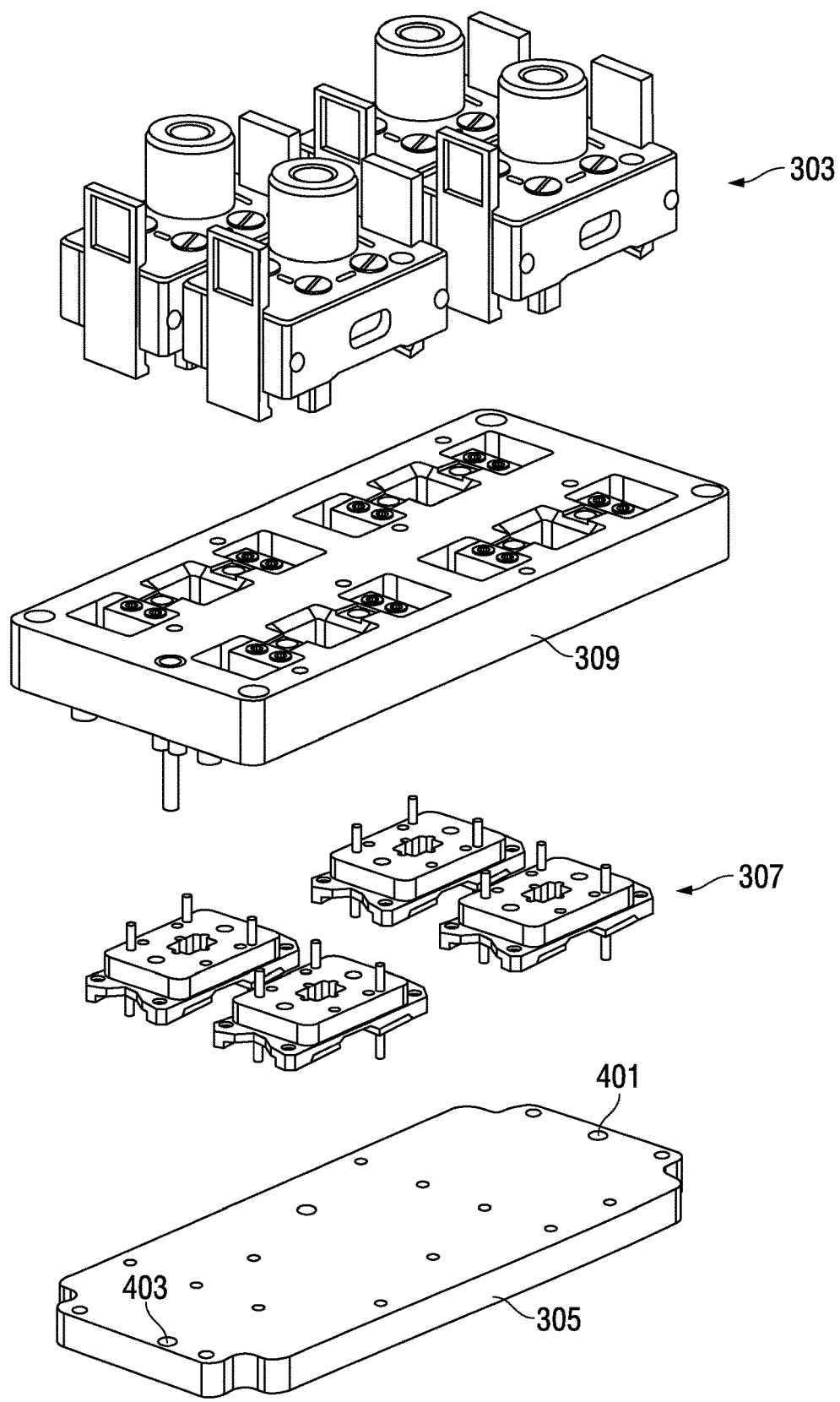
FIG. 4 shows the daughter card in greater detail.

FIG. 4 shows the daughter card in greater detail and shows the asymmetrical holes 401 and 403 that ensure that the daughter card can be placed in the daughter card stiffener in only one orientation. FIG. 4 also illustrates the notches in the corner of the daughter card for contactor alignment brackets.

Figure 5A:
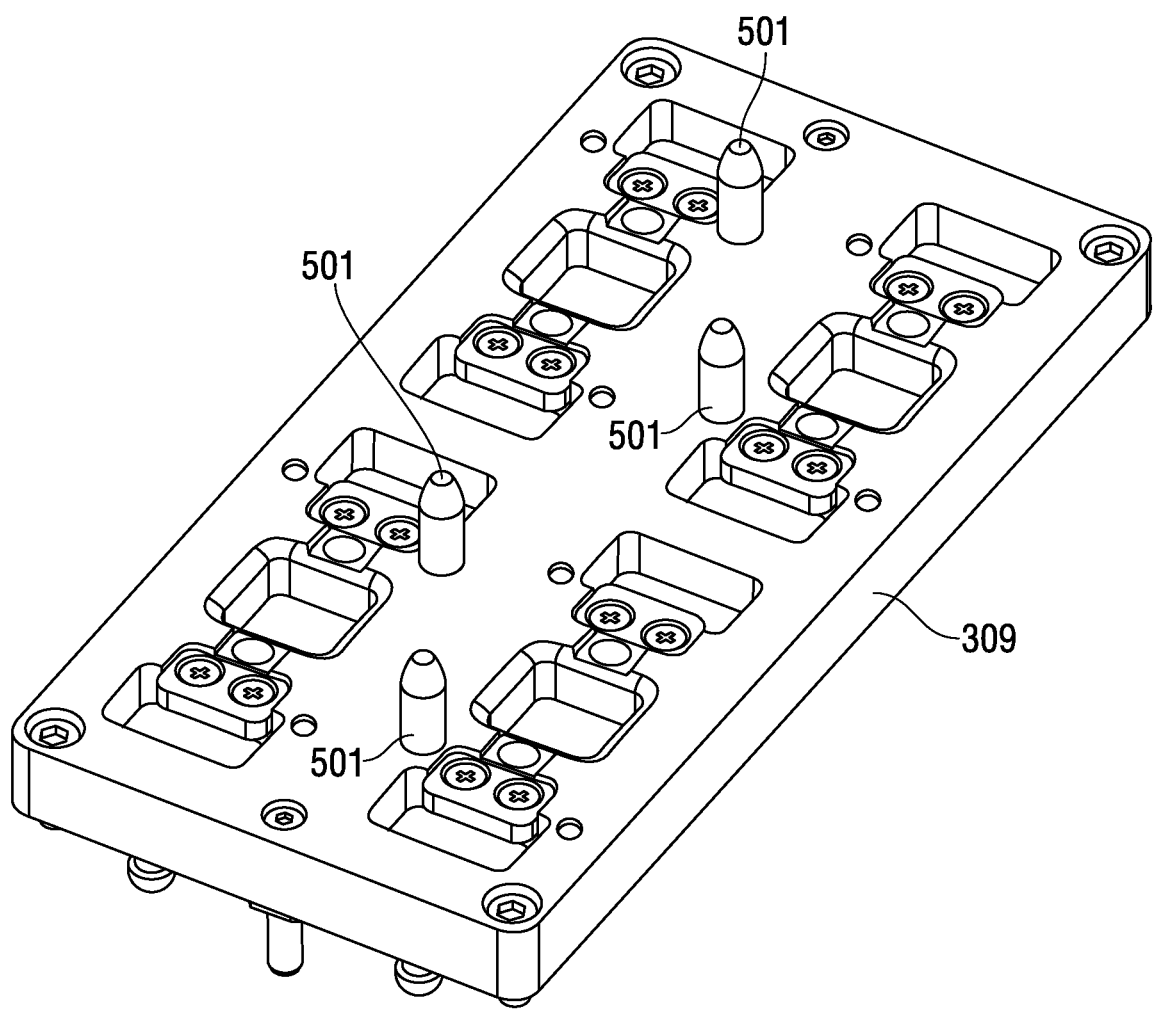
FIG. 5A illustrates a top view of the alignment plate.

FIG. 5A illustrates a view of the top of the alignment plate 309. The IC handler picks up and places integrated circuits in the sockets 307. The IC handler uses alignment pins 501 on the alignment plate 309 to ensure proper alignment of the integrated circuits being placed into the sockets. The alignment pins 501 provide for coarse to fine alignment of the IC handler plunger head as the plunger head goes further down the alignment pins.

Figure 5B:
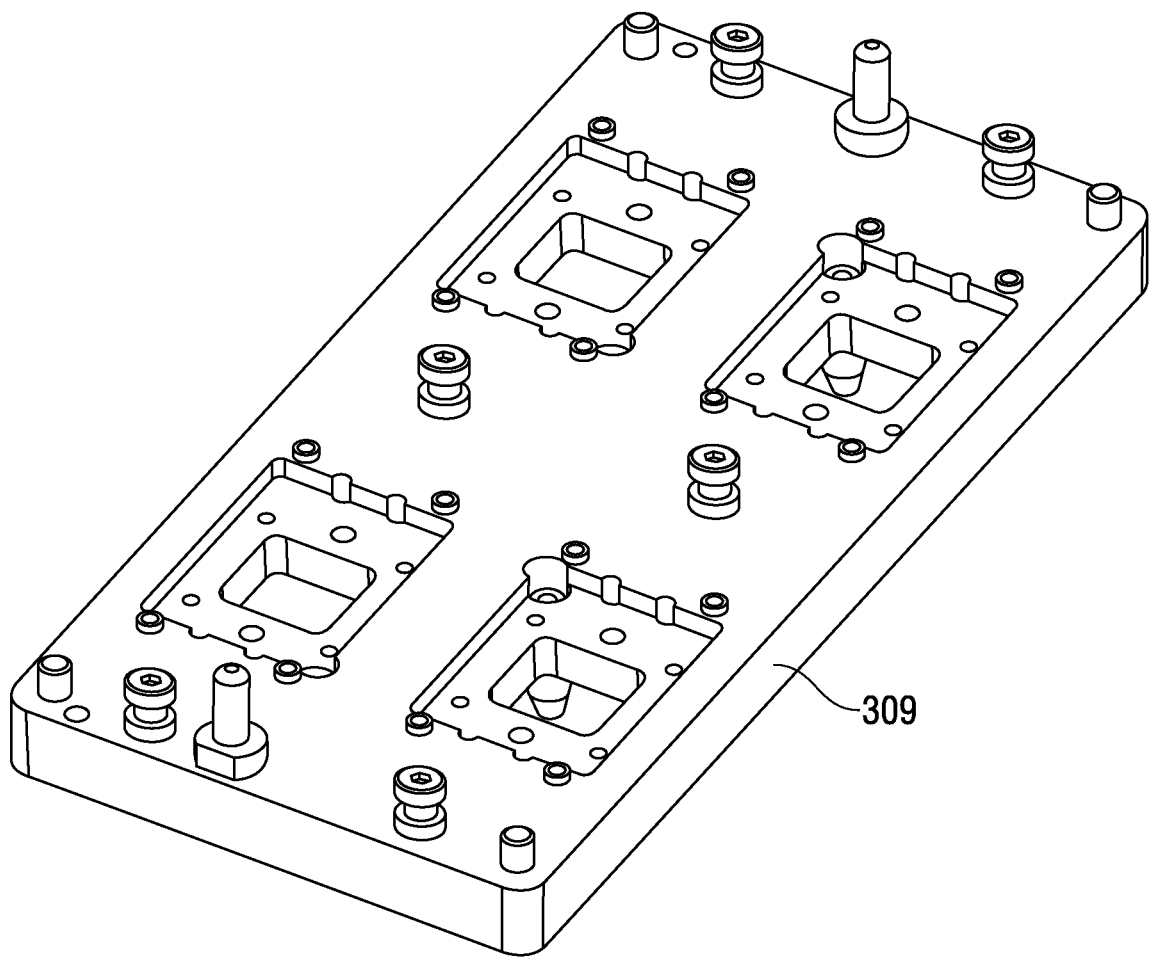
FIG. 5B illustrates a bottom view of the alignment plate

FIG. 5B shows a bottom view of the alignment plate 309.

Figure 6:
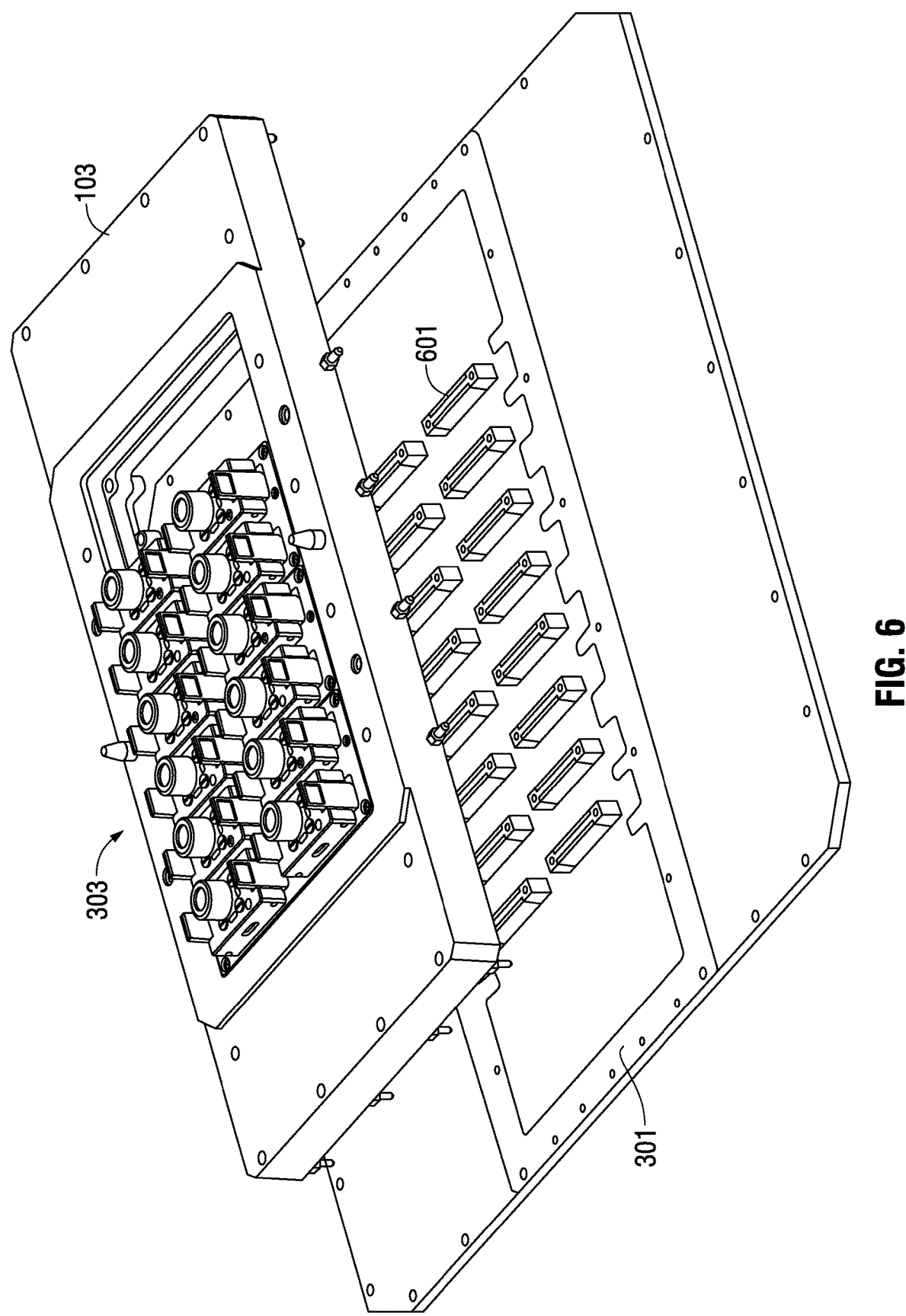
FIG. 6 illustrates additional details of the daughter card stiffener and the device interface board including the sixteen connectors on the device interface board that connect to the daughter cards.
Figure 7:
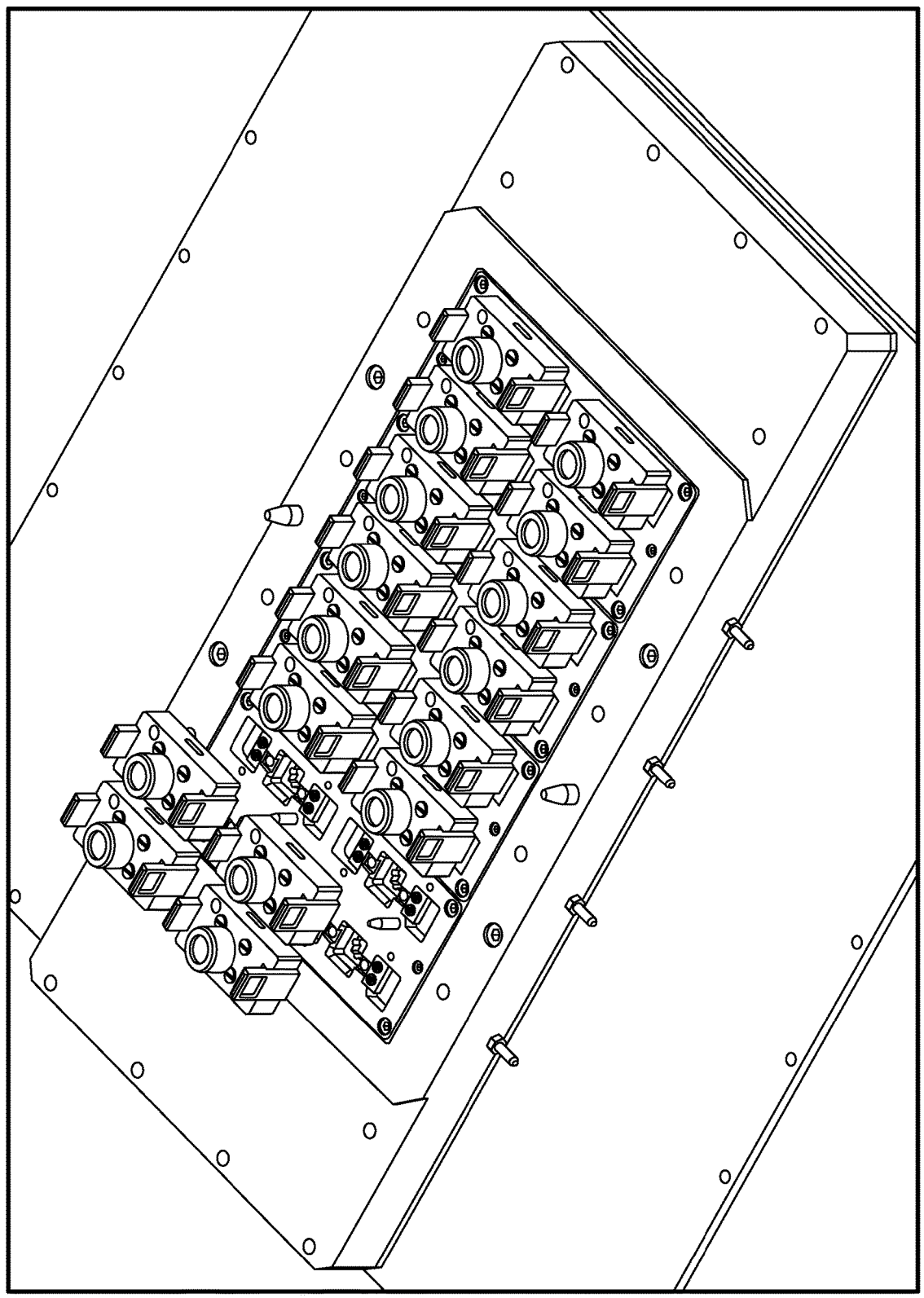
FIG. 7 illustrates another view of the daughter card stiffener with all four daughter card subassemblies installed.
Figure 8:
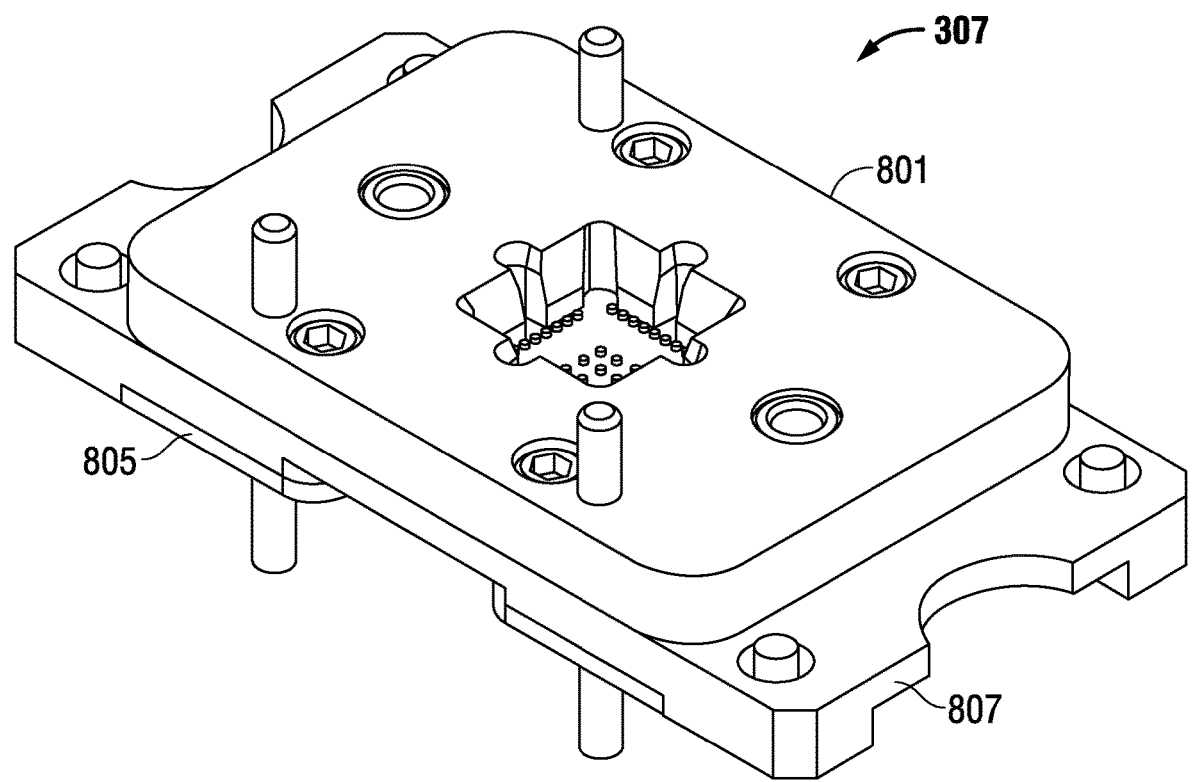
FIG. 8 illustrates the socket in greater detail.
Figure 9:
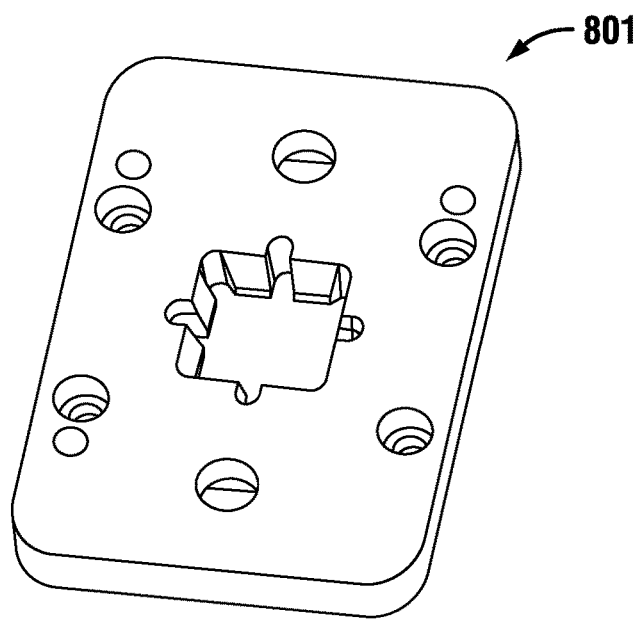
FIG. 9 illustrates the socket alignment plate.
Figure 10:
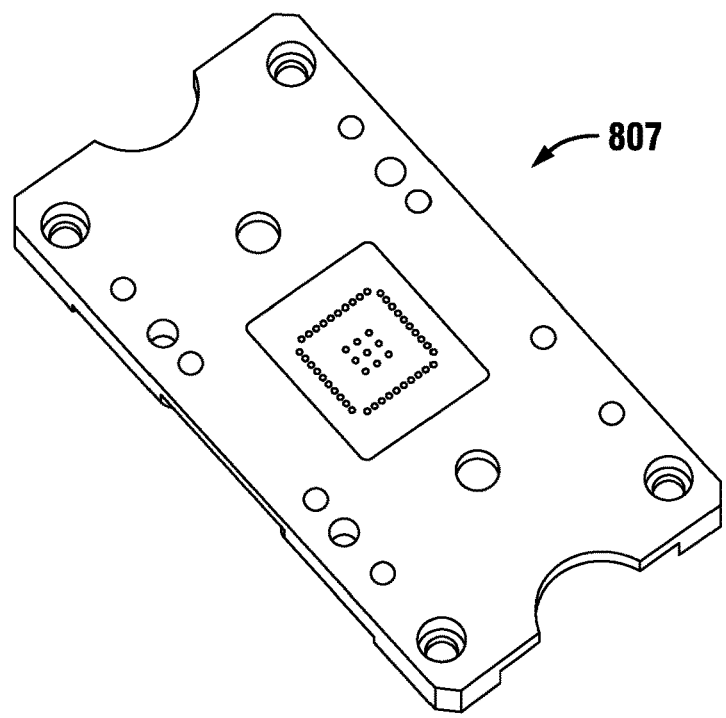
FIG. 10 illustrates the socket housing.
Figure 11:
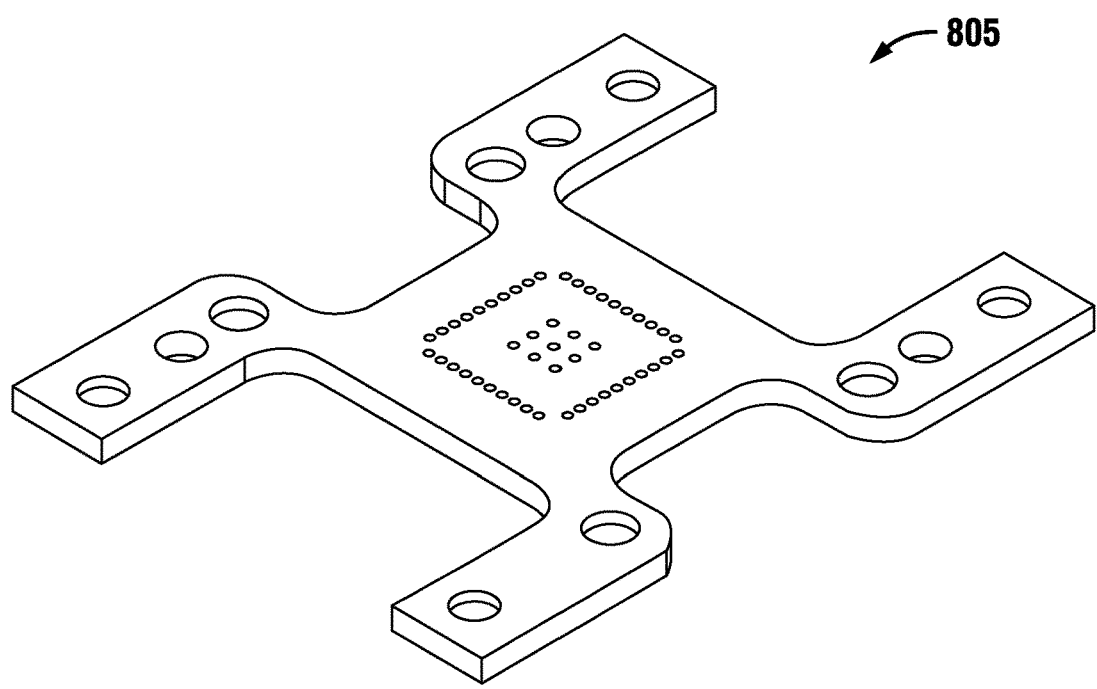
FIG. 11 illustrates the retainer cover of the socket.

FIG. 6 shows additional details of the daughter card stiffener 103 and the device interface board 301 including the sixteen connectors on the device interface board 301 that connect to the daughter cards. FIG. 7 shows another view of the daughter card stiffener with all four daughter card subassemblies installed. Three of the daughter card subassemblies have test lids attached FIG. 8 shows the socket in greater detail including the pogo pins shown in the contactor cavity that receives the integrated circuit. The pogo pins provide electrical contact with the integrated circuit being tested. FIG. 9 shows the socket alignment plate 801. FIG. 10 shows the housing 807. FIG. 11 shows the retainer cover 805 that holds the pogo pins.

Figure 12:
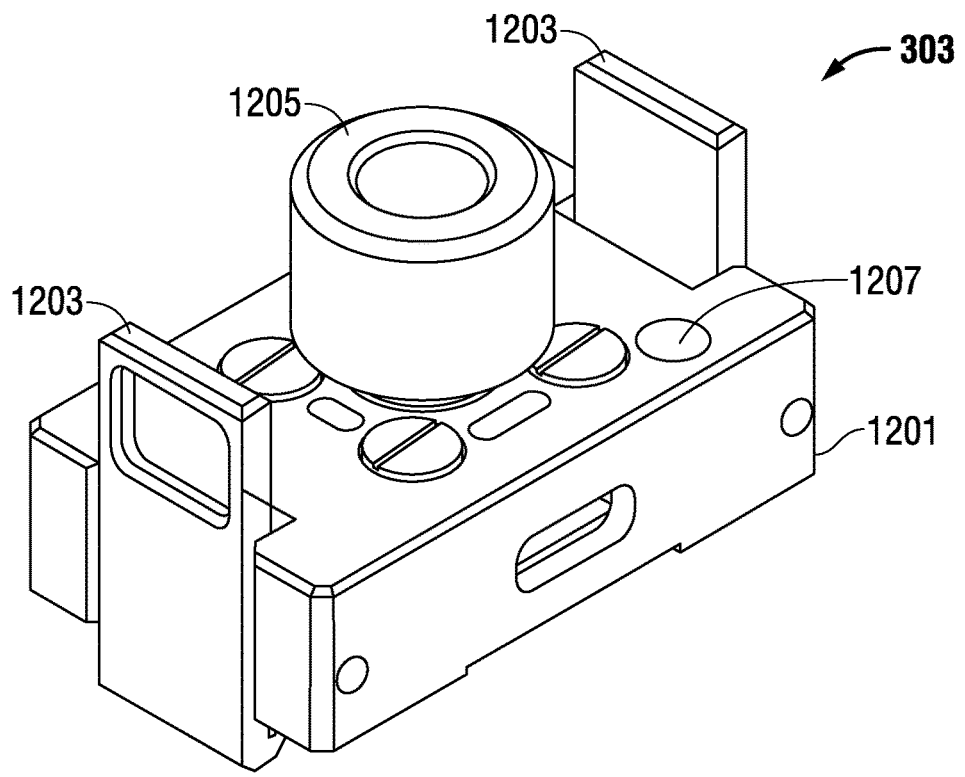
FIG. 12 illustrates the manual test lid.
Figure 13:
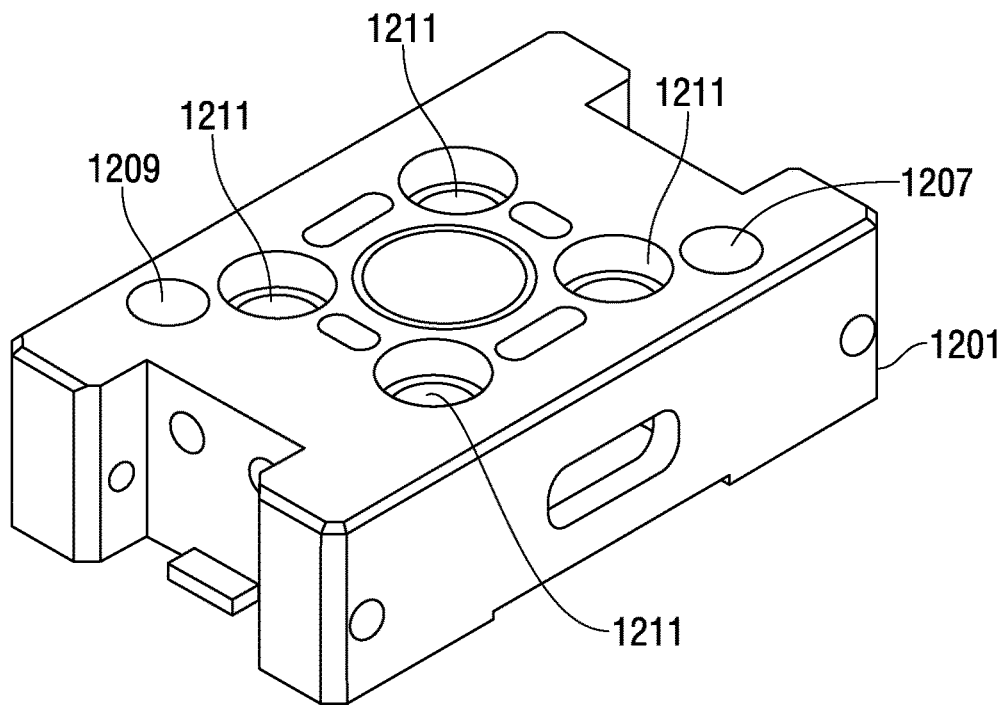
FIG. 13 illustrates the base plate of the manual test lid.
Figure 14:
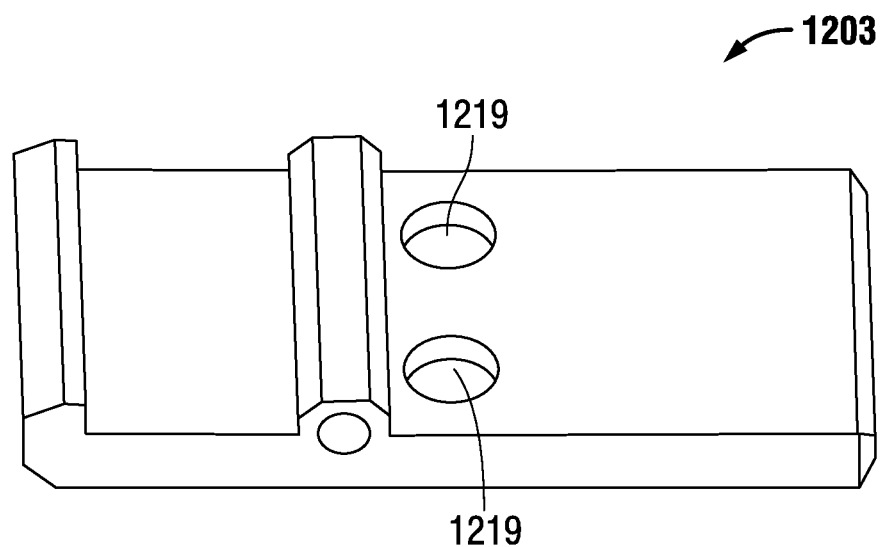
FIG. 14 illustrates the latch of the manual test lid.
Figure 15:
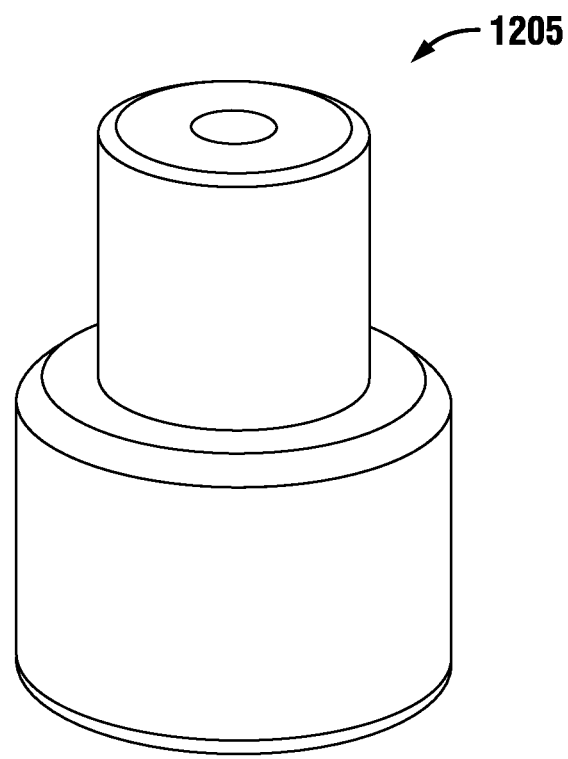
FIG. 15 illustrates the manual test lid handle.

FIG. 12 illustrates a manual test lid 303 in additional detail. The manual test lid includes latches 1203, a handle 1205, and a base plate 1201. The manual test lid includes a hole 1207, which receives one of the alignment pins 501 (see FIG. 5A) as the manual test lid attaches to the alignment plate. Note that the manual test lid includes a second hole placed in the opposite end of the manual test lid and on the opposite side of the manual test lid and hidden by the latch 1203. FIG. 13 shows the base plate 1201 of the manual test lid with both holes 1207 and 1209 for receiving an alignment pin along with holes 1211 to receive the four screws shown in FIG. 12 that keep the various parts of the manual test lid together. The symmetric holes 1207 and 1209 allow the manual test lid to attach to the alignment plate in either of two orientations by rotating the manual test lid by 180 degrees. The use of the alignment pins of the alignment plate ensures that the manual test lid is properly aligned with the socket for manual testing. FIG. 14 illustrates the latch 1203 and recesses 1219 to receive springs for the spring-loaded latches. FIG. 15 illustrates the handle of the manual test lid. When manual test is used, the integrated circuit is placed into the socket and the manual test lid pushes on the device under test in the socket to ensure sufficient pressure on the device under test to make proper contact in the socket. The manual test lid is coupled to the alignment plate by the spring-loaded latches. When switching to automatic test using the IC handler, the manual test lid is removed by squeezing the latches and lifting the test lid. That leaves the socket open to allow the IC handler to place integrated circuits into the sockets. Because the daughter card subassemblies including the IC handler to test fixture interface (the alignment card) are maintained intact, fewer errors result from switching between manual test and automatic test.

The test fixture utilizes a modular approach by having independently accessible daughter card subassemblies (the daughter card, sockets, and alignment plate). That is one daughter card assembly can be removed independently of the other three daughter card assemblies as shown, e.g., in FIG. 3. If there are problems with one of the test sites, e.g., the daughter card assembly can be removed and/or replaced without the need to disassemble the entire test fixture. The modular approach reduces the amount of time and labor required to access suspect integrated circuit test sites for repair or replacement. Further, the modular approach allows different integrated circuit specific daughter cards to be placed in the fixture allowing for testing of different devices in the same test fixture and to support various IC package types and IC handlers.

In addition, the integration of the IC handler to IC test fixture alignment interface (the alignment plate) into the daughter card subassembly reduces the overall rejection rate of devices being tested due to alignment errors because the test setup for the test handler and manual testing is the same in that the daughter card assemblies remain in place. The use of the test fixture alignment for both IC handler and for manual testing results in a lower likelihood of errors when transitioning from manual test to automatic testing or from automatic testing to manual testing. That integration also provides a truer IC handler test simulation when accessing IC test daughter cards and socket locations outside of the IC handler.

Thus, various aspects have been described relating to an improved modular test fixture. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit test fixture comprising:
a device interface board;
a plurality of sockets;
an alignment plate coupled to the sockets and configured to provide alignment between an integrated circuit handler and the integrated circuit test fixture;
one or more manual test lids removably coupled to the alignment plate, the one or more manual test lids coupled to the alignment plate for use during manual testing of one or more integrated circuits, the manual test lids removed from the alignment plate for use of the integrated circuit test fixture with the integrated circuit handler, each of the one or more manual test lids providing pressure on a respective device under test in respective sockets;
a daughter card printed circuit board (PCB) electrically coupled to connectors on the device interface board and electrically coupled to the plurality of sockets and providing an electrical connection between the device interface board and the plurality of sockets;
wherein the alignment plate includes a plurality of alignment pins for aligning the integrated circuit handler; and
wherein each of the one or more manual test lids includes a hole to receive one of the alignment pins to thereby align each of the one or more manual test lids to respective sockets.

2. The integrated circuit test fixture, as recited in claim 1, wherein the one or more manual test lids are removably coupled to the alignment plate with spring-loaded latches.

3. The integrated circuit test fixture, as recited in claim 1, further comprising:
a first subassembly including,
the daughter card printed circuit board (PCB);
the plurality of sockets electrically coupled to the daughter card PCB;
the alignment plate;
a daughter card stiffener into which the first subassembly is disposed;
a second subassembly including,
a second daughter printed circuit board;
a second plurality of sockets;
a second alignment plate; and
wherein the second subassembly is disposed in the daughter card stiffener into which the first subassembly is disposed.

4. An integrated circuit test fixture comprising:
a device interface board;
a plurality of daughter card subassemblies for receiving integrated circuits for testing, the plurality of daughter card subassemblies electrically coupled to the device interface board;
wherein each daughter card subassembly includes a daughter card, a plurality of sockets coupled to the daughter card, and an alignment plate to provide alignment between an integrated circuit handler and each daughter card subassembly, wherein the alignment plate further comprises a plurality of alignment pins for aligning the integrated circuit handler with the integrated circuit test fixture;
a manual test lid removably coupled to the alignment plate, the manual test lid coupled to the alignment plate for use in manual testing one of the integrated circuits and removed from the alignment plate to allow testing with the integrated circuit handler, the manual test lid configured to respectively put pressure on the one of the integrated circuits when the manual test lid is coupled to the alignment plate;
wherein the alignment plate further comprises a plurality of alignment pins for aligning the integrated circuit handler with the integrated circuit test fixture; and
wherein the manual test lid includes a first hole to receive one of the alignment pins when the manual test lid is coupled to the alignment plate to thereby align the manual test lid with one of the sockets.

5. The integrated circuit test fixture, as recited in claim 4, further comprising:
a daughter card stiffener into which a first daughter card subassembly of the plurality of daughter card subassemblies is disposed; and
wherein a second daughter card subassembly of the plurality of daughter card subassemblies is disposed in the daughter card stiffener into which the first daughter card subassembly is disposed.

6. The integrated circuit test fixture, as recited in claim 5, wherein the first and second daughter card subassemblies are independently and removably coupled to the daughter card stiffener.

7. The integrated circuit test fixture, as recited in claim 5, wherein the first daughter card subassembly includes two by two sockets for receiving four integrated circuits for manual testing or automatic testing of the integrated circuits.

8. The integrated circuit test fixture, as recited in claim 4, wherein there are an equal number of alignment pins and sockets.

9. The integrated circuit test fixture, as recited in claim 4, wherein the manual test lid includes the first hole and a second hole, respectively disposed in first and second ends of the manual test lid, the first and second holes disposed in opposite directions from a center line along a length of the manual test lid to thereby receive one of the alignment pins when attached to the alignment plate to thereby allow the manual test lid to be coupled above the one of the sockets in both a first orientation and a second orientation 180 degrees rotated from the first orientation.

10. The integrated circuit test fixture, as recited in claim 4, wherein the plurality of daughter card subassemblies for receiving integrated circuits for test are independently removable from a daughter card stiffener into which the daughter card subassemblies are disposed.

11. The integrated circuit test fixture, as recited in claim 4, wherein each daughter card subassembly includes four device contactors arranged in a two by two configuration for receiving four integrated circuits for manual testing or automatic testing.

12. The integrated circuit test fixture, as recited in claim 4, wherein the integrated circuit test fixture comprises four daughter card subassemblies.

13. An integrated circuit test fixture comprising:
a plurality of daughter card subassemblies for receiving integrated circuits for testing, wherein each daughter card subassembly includes a daughter card, a plurality of sockets electrically and mechanically coupled to the daughter card;
alignment plates to provide alignment between an integrated circuit handler and respective ones of the daughter card subassemblies;

a manual test lid removably coupled to one of the alignment plates, the manual test lid coupled to one of the alignment plates for use during manual testing of a device under test, the manual test lid removed from the one of the alignment plates for use of the integrated circuit test fixture with the integrated circuit handler, the manual test lid to provide pressure on the device under test during the manual testing;

wherein the one of the alignment plates further provides alignment for the manual test lid with one of the sockets; and wherein the one of the alignment plates comprises a plurality of alignment pins for aligning the integrated circuit handler with the integrated circuit test fixture and for aligning the manual test lid and wherein of the manual test lid includes a hole to receive one of the alignment pins in the one of the alignment plates.

14. The integrated circuit test fixture, as recited in claim 13, wherein the manual test lid includes the hole and a second hole, respectively disposed in first and second ends of the manual test lid, the hole and second hole disposed in opposite directions from a center line along a length of the manual test lid to thereby receive one of the alignment pins when attached to the one of the alignment plates to thereby allow the manual test lid to be coupled above one of the sockets in both a first orientation and a second orientation 180 degrees rotated from the first orientation.

* * * * *